(12) United States Patent
Zhu et al.

(10) Patent No.: US 12,196,617 B2
(45) Date of Patent: Jan. 14, 2025

(54) TEMPERATURE PROFILE MEASUREMENT AND SYNCHRONIZED CONTROL ON SUBSTRATE AND SUSCEPTOR IN AN EPITAXY CHAMBER

(71) Applicant: Applied Materials, Inc., Santa Clara, CA (US)

(72) Inventors: Zuoming Zhu, Sunnyvale, CA (US); Shu-Kwan Lau, Sunnyvale, CA (US); Enle Choo, Saratoga, CA (US); Ala Moradian, Sunnyvale, CA (US); Flora Fong-Song Chang, Saratoga, CA (US); Maxim D. Shaposhnikov, Sunnyvale, CA (US); Bindusagar Marath Sankarathodi, San Jose, CA (US); Zhepeng Cong, San Jose, CA (US); Zhiyuan Ye, San Jose, CA (US); Vilen K. Nestorov, Pleasanton, CA (US); Surendra Singh Srivastava, Santa Clara, CA (US); Saurabh Chopra, Santa Clara, CA (US); Patricia M. Liu, Saratoga, CA (US); Errol Antonio C. Sanchez, Tracy, CA (US); Jenny C. Lin, Saratoga, CA (US); Schubert S. Chu, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 424 days.

(21) Appl. No.: 17/609,335

(22) PCT Filed: Jun. 29, 2020

(86) PCT No.: PCT/US2020/040160
§ 371 (c)(1),
(2) Date: Nov. 5, 2021

(87) PCT Pub. No.: WO2021/021357
PCT Pub. Date: Feb. 4, 2021

(65) Prior Publication Data
US 2022/0155148 A1 May 19, 2022

Related U.S. Application Data

(60) Provisional application No. 62/879,347, filed on Jul. 26, 2019.

(51) Int. Cl.
*G01J 5/00* (2022.01)
*H01L 21/67* (2006.01)

(52) U.S. Cl.
CPC ...... *G01J 5/0007* (2013.01); *H01L 21/67115* (2013.01); *H01L 21/67248* (2013.01)

(58) Field of Classification Search
CPC ................. H01L 21/67115; H01L 21/67248
See application file for complete search history.

(56) References Cited

U.S. PATENT DOCUMENTS 3,995,797 A * 12/1976 Knight ............... F16M 11/18
248/656
5,455,070 A * 10/1995 Anderson ............. C23C 16/455
438/758

(Continued)

FOREIGN PATENT DOCUMENTS

DE 10220639 A1 * 12/2002 ........ H01L 21/67115
DE 10305729 A1 * 8/2003 ........... C23C 16/045

(Continued)

OTHER PUBLICATIONS

17609335_2024-04-30_DE_10220639_A1_H.pdf,2002-12-05.*

(Continued)

*Primary Examiner* — Gail Kaplan Verbitsky
(74) *Attorney, Agent, or Firm* — Patterson + Sheridan, LLP

(57) ABSTRACT

An apparatus for controlling temperature profile of a substrate within an epitaxial chamber includes a bottom center (Continued)

pyrometer and a bottom outer pyrometer to respectively measure temperatures at a center location and an outer location of a first surface of a susceptor of an epitaxy chamber, a top center pyrometer and a top outer pyrometer to respectively measure temperatures at a center location and an outer location of a substrate disposed on a second surface of the susceptor opposite the first surface, a first controller to receive signals, from the bottom center pyrometer and the bottom outer pyrometer, and output a feedback signal to a first heating lamp module that heats the first surface based on the measured temperatures of the first surface, and a second controller to receive signals, from the top center pyrometer, the top outer pyrometer, the bottom center pyrometer, and the bottom outer pyrometer, and output a feedback signal to a second heating lamp module that heats the substrate based on the measured temperatures of a substrate and the measured temperatures of the first surface.

20 Claims, 4 Drawing Sheets

(56) References Cited

U.S. PATENT DOCUMENTS

| | | | | |
|---|---|---|---|---|
| 5,650,082 | A | * | 7/1997 | Anderson ............ C23C 16/481 |
| | | | | 219/390 |
| 5,802,099 | A | * | 9/1998 | Curran ................... G01J 5/041 |
| | | | | 374/126 |
| 5,809,211 | A | * | 9/1998 | Anderson ............ H01L 23/345 |
| | | | | 219/390 |
| 6,064,799 | A | * | 5/2000 | Anderson ......... H01L 21/67248 |
| | | | | 219/390 |
| 6,130,105 | A | * | 10/2000 | Redinbo ................ C23C 16/52 |
| | | | | 118/667 |
| 2001/0020439 | A1 | * | 9/2001 | Tobashi .................. C23C 16/46 |
| | | | | 117/86 |
| 2001/0041258 | A1 | * | 11/2001 | Passek .................... G01Q 40/02 |
| | | | | 427/256 |
| 2003/0062359 | A1 | * | 4/2003 | Ho ..................... H01L 21/67109 |
| | | | | 219/468.1 |
| 2004/0053515 | A1 | * | 3/2004 | Comita ............. H01L 21/02532 |
| | | | | 257/E21.119 |
| 2005/0120961 | A1 | * | 6/2005 | Kubo ................ H01L 21/67109 |
| | | | | 118/728 |
| 2007/0062439 | A1 | * | 3/2007 | Wada ....................... C30B 25/16 |
| | | | | 117/89 |
| 2009/0314205 | A1 | * | 12/2009 | Patalay .............. G02B 23/2492 |
| | | | | 118/713 |
| 2012/0118225 | A1 | * | 5/2012 | Hsu ................... H01L 21/67248 |
| | | | | 118/667 |
| 2012/0201267 | A1 | * | 8/2012 | Patalay ...................... G01J 5/12 |
| | | | | 374/1 |
| 2013/0130184 | A1 | * | 5/2013 | Lu ........................... F27D 21/00 |
| | | | | 432/32 |
| 2015/0037017 | A1 | * | 2/2015 | Lau ....................... H05B 3/0047 |
| | | | | 219/730 |
| 2018/0010243 | A1 | * | 1/2018 | Lee ........................... H01L 21/78 |
| 2019/0127851 | A1 | | 5/2019 | Lau et al. |

FOREIGN PATENT DOCUMENTS

| | | | | |
|---|---|---|---|---|
| JP | 11079887 | | 3/1999 | |
| JP | 2006-303289 A | | 11/2006 | |
| NL | 7805887 A | * | 2/1979 | ............. F16M 11/10 |
| WO | WO-9957751 A2 | * | 11/1999 | ........ H01L 21/67115 |
| WO | WO-03040636 A1 | * | 5/2003 | ........... C23C 16/481 |

OTHER PUBLICATIONS

17609335_2024-04-30_DE_10305729_A1_H.pdf,2003-08-28.*
17609335_2024-04-30_WO_03040636_A1_H.pdf,2003-05-15.*
17609335_2024-04-30_WO_9957751_A2_H.pdf,1999-11-11.*
17609335_2024-08-30_NL_7805887_A_H.pdf,1979-02-21.*
International Search Report dated Oct. 13, 2020 for Application No. PCT/US2020/040160.

* cited by examiner

TEMPERATURE PROFILE MEASUREMENT AND SYNCHRONIZED CONTROL ON SUBSTRATE AND SUSCEPTOR IN AN EPITAXY CHAMBER

FIELD

Embodiments of the present disclosure generally relate to temperature profile measurement and control on a substrate and a susceptor in an epitaxy chamber.

BACKGROUND

Semiconductor substrates are processed for a wide variety of applications, including fabrication of integrated devices and micro-devices. One such substrate processing is epitaxial growth of a film of a material, such as a semiconductor material or a conductive material, on an upper surface of a substrate within a processing chamber. Epitaxy processes can produce high-quality films on substrates under certain controlled process conditions, such as temperatures, pressures, and precursor flow rates within the processing chambers. In particular, temperature of a substrate and temperature uniformity across the substrate is necessary for producing repeatable and uniform films. Any variation in the process conditions can result in poor film qualities.

In processing chambers, susceptors are often used to support a substrate as well as transfer heat to the substrate during epitaxy processes. Typically, temperature of a susceptor and a substrate in a processing chamber are controlled through a close-loop control of a heating source, such as a plurality of heating lamps.

Despite the control of the heating source, temperature profiles that vary across the susceptor and the substrate are conventionally not monitored and controlled. Thus, a deposited film is non-uniform across the substrate and the deposition of a film is not repeatable in subsequent epitaxy processes. Therefore, there is a need for apparatuses and methods to measure and control temperature profiles across the susceptor and the substrate during an epitaxy process as well as its repeatability from process to process.

SUMMARY

In one embodiment, an apparatus for controlling temperature profile of a substrate within an epitaxial chamber is provided, including a bottom center pyrometer disposed on a bottom mounting plate of an epitaxy chamber and configured to measure temperature at a center location of a first surface of a susceptor of the epitaxy chamber, the first surface being heated by a first heating lamp module, a bottom outer pyrometer disposed on the bottom mounting plate and configured to measure temperature at an outer location of the first surface of the susceptor, a top center pyrometer disposed on a top mounting plate of the epitaxy chamber and configured to measure temperature at a center location of a top surface of a substrate positioned on a second surface of the susceptor opposite the first surface of the susceptor, the substrate being heated by a second heating lamp module, where an epitaxy reactor is disposed between the top mounting plate and the bottom mounting plate within the epitaxy chamber, a top outer pyrometer disposed on the top mounting plate and configured to measure temperature at an outer location of a top surface of a substrate positioned on the second surface of the susceptor, a first controller configured to output a feedback signal to the first heating lamp module based on the measured temperatures at the center location and at the outer location of the first surface of the susceptor, and a second controller configured to output a feedback signal to the second heating lamp module based on the measured temperatures at the center location and at the outer location of a top surface of a substrate positioned on the second surface of the susceptor and the measured temperatures at the center location and at the outer location of the first surface of the susceptor.

In another embodiment, a method of depositing a film on a substrate disposed in an epitaxy chamber is provided, including measuring a temperature at a center location of a first surface of a susceptor of the epitaxy chamber, measuring a temperature at an outer location of the first surface of the susceptor of the epitaxy chamber, measuring a temperature at a center location of a top surface of a substrate disposed on a second surface of the susceptor of the epitaxy chamber, measuring a temperature at an outer location of the top surface of the substrate, adjusting power of a first heating lamp module positioned to heat the first surface of the susceptor based on the measured temperatures at the center location and the outer location of the first surface of the susceptor, and adjusting power of a second heating lamp module positioned to heat the substrate on the second surface of the susceptor based on the measured temperatures at the center location and the outer location of the top surface of the substrate and the measured temperatures at the center location and the outer location of the first surface of the susceptor.

In another embodiment, a method of processing a plurality of substrates in an epitaxy chamber is provided, including measuring temperatures at a center location and at an outer location of a first surface of a susceptor of the epitaxy chamber during a first epitaxy process, measuring temperatures at a center location and at an outer location of a top surface of a first substrate disposed on a second surface of the susceptor of the epitaxy chamber during the first epitaxy process, measuring temperatures at the center location and at the outer location of the first surface of the susceptor of the epitaxy chamber during a second epitaxy process, measuring temperatures at the center location and at the outer location of a top surface of a second substrate disposed on the second surface of the susceptor of the epitaxy chamber during the second epitaxy process, during the second epitaxy process, adjusting power of a first heating lamp module that is configured to heat the first surface of the susceptor based on the measured temperatures at the center location and at the outer location of the first surface of the susceptor during the first and second epitaxy processes, and during the second epitaxy process, adjusting power of a second heating lamp module that is configured to heat the top surface of the second substrate disposed on the second surface of the susceptor based on the measured temperatures at the center location and at the outer location of the first and second substrates during the first and second epitaxy processes.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to temperature profile measurement and control on a substrate and a susceptor in an epitaxy chamber. In an epitaxy chamber, temperature variations over a substrate (also referred to as temperature profiles of a substrate) may be affected by a heat source, such as a heating lamp module, that heats the substrate. The temperature profiles of the substrate are also affected by temperature profiles of a susceptor that supports the substrate thereon within the epitaxy chamber due to heat transfer between the substrate and the susceptor. Thus, in the example embodiments described below, an apparatus and methods of feedback control of the temperature profiles of a substrate and a susceptor that supports the substrate increase uniformity in temperatures over the substrate, leading to an epitaxy growth of a high-quality film on the substrate.

Figure 1:
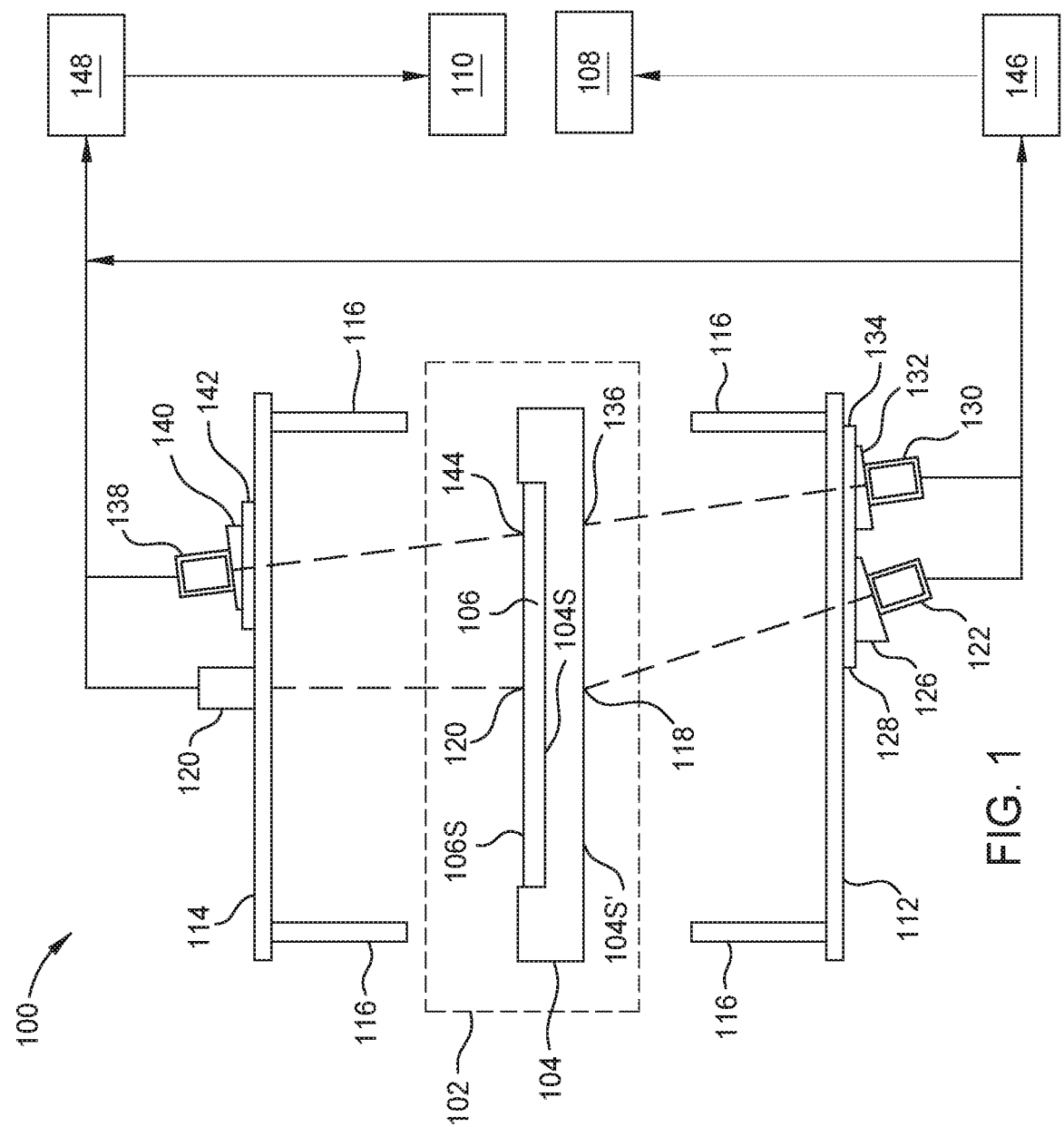
FIG. 1 illustrates an epitaxy (Epi) chamber according to one embodiment.
Figure 2:
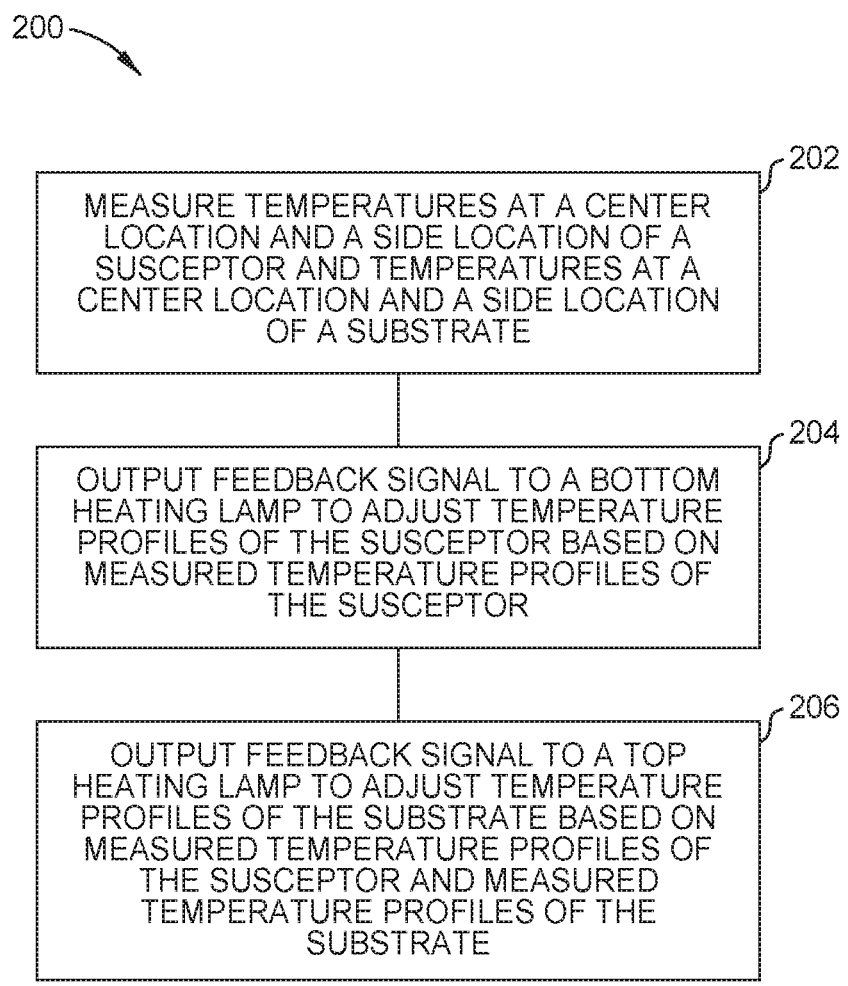
FIG. 2 is a flow diagram of a method 200 for monitoring and controlling temperature profiles according to one embodiment.

FIG. 1 illustrates an epitaxy (Epi) chamber 100 according to one embodiment. FIG. 2 is a flow diagram of a method 200 for monitoring and controlling temperature profiles according to one embodiment. FIGS. 1 and 2 will be explained in conjunction to facilitate explanation of aspects of the disclosure.

As shown in FIG. 1, the Epi chamber 100 includes an Epi reactor 102. Within the Epi reactor 102, a susceptor 104 that supports a substrate 106 on a top surface 104S of the susceptor 104 are disposed. In some embodiments, the susceptor 104 is a disc shape having a diameter of between about 280 mm and 380 mm and the substrate 106 is, for example, a 300 mm wafer. A bottom surface 104S' of the susceptor 104 opposite the top surface 104S is heated by a bottom heating lamp module 108 having an inner zone and an outer zone (not shown). The inner zone and the outer zone of the bottom lamp module can be independently controlled to heat an inner portion and an outer portion of the susceptor 104, respectively. The substrate 106 is heated separately by a top heating lamp module 110 having an inner zone and an outer zone (not shown). The inner zone and the outer zone of the top lamp module can be independently controlled to heat an inner portion and an outer portion of the substrate 106, respectively. The Epi chamber 100 further includes a bottom mounting plate 112 below the Epi reactor 102 and a top mounting plate 114 above the Epi reactor 102. Reflectors 116 are positioned above the bottom mounting plate 112 and below the top mounting plate 114 to reflect radiation originating from the bottom heating lamp module 108 and the top heating lamp module 110.

The temperature at a center location 118 of the bottom surface 104S' of the susceptor 104 and the temperature at a center location 120 of a top surface 106S of the substrate 106 are respectively measured by a bottom center optical pyrometer 122 disposed on the bottom mounting plate 112 and a top center optical pyrometer 124 disposed on the top mounting plate 114. The bottom center optical pyrometer 122 is mounted on an angle block 126 disposed on a mounting block 128 on the bottom mounting plate 112. A specific location of the bottom surface 104S' of the susceptor 104 that the bottom center optical pyrometer 122 measures is determined by a viewing angle of the angle block 126 with respect to the bottom mounting plate 112 and a position of the mounting block 128 on the bottom mounting plate 112. In some embodiments, the angle block 126 and the mounting block 128 are adjusted such that the bottom center optical pyrometer 122 measures the temperature at the center location 118 of the bottom surface 104S' of the susceptor 104. In some embodiments, the top center optical pyrometer 124 is positioned directly above the center location 120 of the top surface 106S of the substrate 106 such that the top center optical pyrometer 124 measures the temperature at the center location 120 of the top surface 106S of the substrate 106.

However, by this measurement alone, temperature profiles of the susceptor 104 and substrate 106 cannot be measured and monitored.

For measuring and monitoring the temperature profiles of the susceptor 104 and the substrate 106, one or more additional optical pyrometers are used to measure temperatures at outer locations of the bottom surface 104S' of the susceptor 104 and the substrate 106. In some embodiments, the Epi chamber 100 includes a bottom outer optical pyrometer 130 mounted on an angle block 132 disposed on a mounting block 134 on the bottom mounting plate 112 to measure temperature at an outer location of the bottom surface 104S' of the susceptor 104 that is spaced from the center location of the bottom surface 104S' of the susceptor 104. An angle of the angle block 132 and a position of the mounting block 134 are adjusted such that the bottom outer optical pyrometer 130 measures the temperature at the outer location 136 of the bottom surface 104S' of the susceptor 104. The Epi chamber 100 further includes a top outer optical pyrometer 138 mounted on an angle block 140 disposed on a mounting block 142 on the top mounting plate 114 to measure temperature at an outer location 144 of the top surface 106S of the substrate 106 that is spaced from the center location 120 of the top surface 106S of the substrate 106. An angle of the angle block 140 and a position of the mounting block 142 are adjusted such that the top outer optical pyrometer 138 measures the temperature at the outer location 144 of the substrate 106.

Although FIG. 1 only illustrates one top outer optical pyrometer 138, more than one top outer optical pyrometers 138 may be used to simultaneously measure temperatures at multiple locations of the top surface 106S of the substrate 106. With the top center optical pyrometer 124 and one or more top outer optical pyrometer 138, temperature profiles of the substrate (e.g., a temperature drift between a center of the substrate 106 and an outer of the substrate 106) can be measured.

Similarly, although FIG. 1 only illustrates one bottom outer optical pyrometer 130, more than one bottom outer optical pyrometer 130 may be used to simultaneously measure temperatures at multiple locations of the bottom surface 104S' of the susceptor 104. With the bottom center optical pyrometer 122 and one or more bottom outer optical pyrometer 130, temperature profiles of the susceptor 104 (e.g., a temperature drift between a center of the susceptor 104 and an outer of the susceptor 104) can be measured and controlled.

The temperature data collected from the bottom center optical pyrometer 122 and the bottom outer optical pyrometer 130 is input to a susceptor controller 146. The susceptor controller 146 may include a central processing unit (CPU), memory, support circuits (or I/O), and a user interface, such as graphics processing unit (GPU). The CPU may be one of any form of computer processors that are used in industrial settings for controlling various processes and hardware (e.g., pattern generators, motors, and other hardware) and monitor the processes (e.g., processing time and substrate position or location). The memory is connected to the CPU, and may be one or more of a readily available memory, such as random access memory (RAM), read only memory (ROM), floppy disk, hard disk, or any other form of digital storage, local or remote. Software instructions, algorithms and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the susceptor controller 146 determines which tasks are performable on the bottom heating lamp module 108. The program may be software readable by the susceptor controller 146 and may include a code to output feedback signal to the bottom heating lamp module 108 based on input data from the bottom center optical pyrometer 122 and the bottom outer optical pyrometer 130.

The temperature data collected from the top center optical pyrometer 124 and the top outer optical pyrometer 138 is input to a substrate controller 148. The substrate controller 148 may include a central processing unit (CPU), memory, support circuits (or I/O), and a user interface, such as graphics processing unit (GPU). The CPU may be one of any form of computer processors that are used in industrial settings for controlling various processes and hardware (e.g., pattern generators, motors, and other hardware) and monitor the processes (e.g., processing time and substrate position or location). The memory is connected to the CPU, and may be one or more of a readily available memory, such as random access memory (RAM), read only memory (ROM), floppy disk, hard disk, or any other form of digital storage, local or remote. Software instructions, algorithms and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the substrate controller 148 determines which tasks are performable on the top heating lamp module 110. The program may be software readable by the controller and may include a code to output feedback signal to the top heating lamp module 110 based on input data from the top center optical pyrometer 124 and the top outer optical pyrometer 138.

The method 200 begins at block 202. In block 202, the bottom center optical pyrometer 122 measures temperature at a center location 118 of the bottom surface 104S' of the susceptor 104, and the bottom outer optical pyrometer 130 measures an outer location 136 of the bottom surface 104S' of the susceptor 104. The susceptor controller 146 receives the measured temperatures at the center location 118 and the outer location 136 of the bottom surface 104S' of the susceptor 104 and monitors temperature profiles across the susceptor 104 during an epitaxy process.

Furthermore, the top center optical pyrometer 124 measures temperature at a center location 120 of the top surface 106S of the substrate 106, and the top outer optical pyrometer 138 measures an outer location 144 of the top surface 106S of the substrate 106. The substrate controller 148 receives the measured temperatures at the center location 120 and the outer location 144 of the top surface 106S of the substrate 106 and monitors temperature profiles across the substrate 106 during an epitaxy process.

In block 204, based on the measured temperature profiles of the susceptor 104, the susceptor controller 146 outputs feedback signals to the bottom heating lamp module 108 to dynamically and automatically adjust the temperature profiles of the susceptor 104 such that the temperature will be uniform across the susceptor 104. The temperatures of the center location 118 and the outer location 136 of the bottom surface 104S' of the susceptor 104 are independently adjusted by the inner zone and the outer zone, respectively, of the bottom heating lamp module 108. If a temperature drift between the center location 118 and the outer location 136 of the bottom surface 104S' of the susceptor 104 that is greater than a predetermined value is detected, the susceptor controller 146 may display a message on the use interface, such as GPU (not shown) to prompt a user to make manual corrections or the like.

In block 206, based both on the measured temperature profiles of the susceptor 104 and the measured temperature profiles of the substrate 106, the substrate controller 148 outputs feedback signals to the top heating lamp module 110 to dynamically and automatically adjust the temperature profiles of the substrate 106 such that the temperature will be uniform across the substrate 106. This feedback control (also referred to as a closed-loop control) is performed independently from the feedback control of the temperature of the susceptor 104. The temperatures of the center location 120 and the outer location 144 of the top surface 106S of the substrate 106 are independently adjusted by the inner zone and the outer zone, respectively, of the top heating lamp module 110. If a temperature drift between the center location 120 and the outer location 144 of the substrate 106 that is greater than a predetermined value is detected, the substrate controller 148 may display a message on the use interface, such as GPU (not shown) to prompt a user to make manual corrections or the like.

The feedback control of the temperature profiles of the substrate 106 is performed during an initial stabilization step of an epitaxy process.

It should be noted that the particular example embodiments described above are just some possible examples of temperature profile measurement and control on a substrate and a susceptor in an epitaxy chamber according to the present disclosure and do not limit the possible configurations, specifications, or the like of the temperature profile measurement and control. For example, the method described above can be applied not only to detect and control a temperature drift on a single substrate during an epitaxy process but also to a temperature drift between one substrate to another during multiple epitaxy processes. In this case, temperature profiles of a baseline substrate or averaged temperature profiles of a group of substrates are used as a reference to which the feedback control adjusts the temperature profiles.

Figure 3:
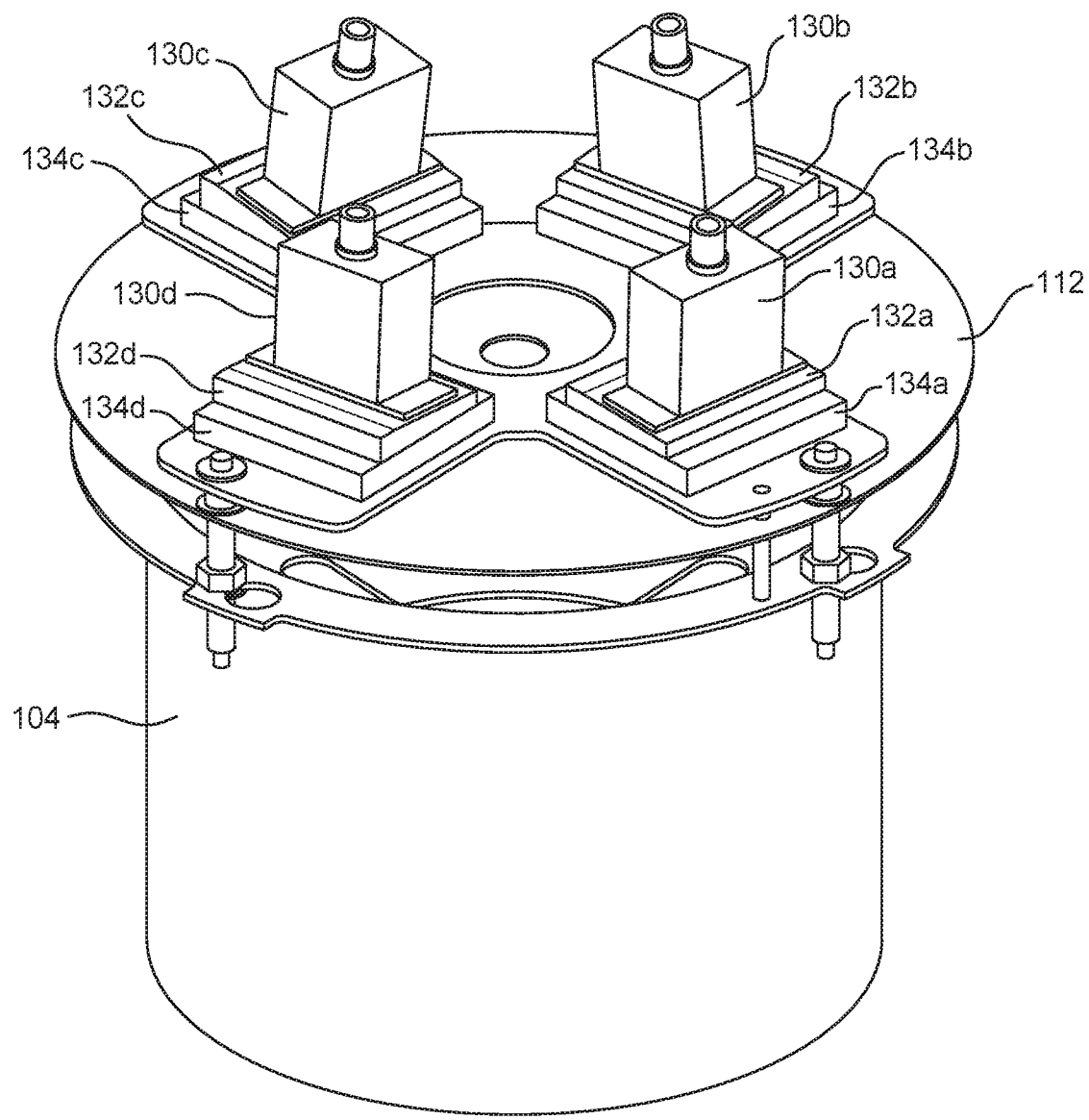
FIG. 3 illustrates a susceptor according to one embodiment.
Figure 4:
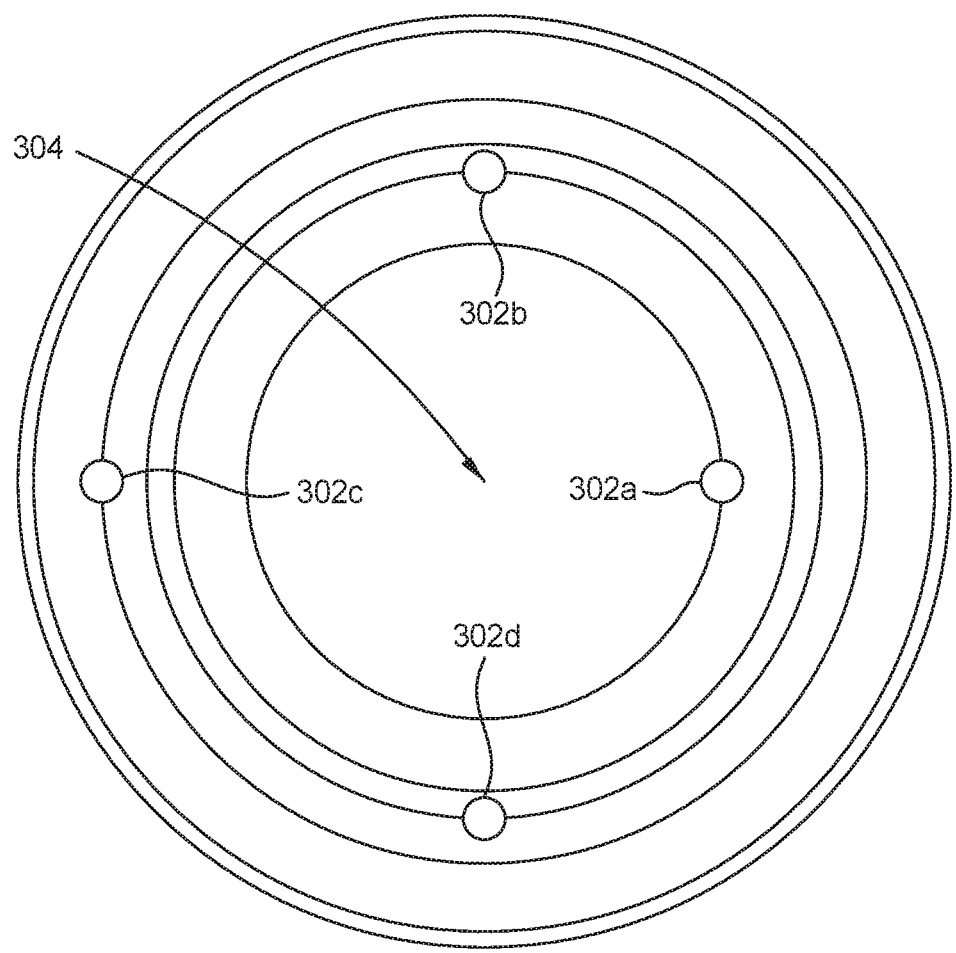
FIG. 4 illustrates outer locations of a susceptor according to one embodiment.

In some embodiments, four bottom outer optical pyrometers 130 are disposed on the bottom mounting plate 112. The bottom outer optical pyrometers 130 are respectively mounted on the angle blocks 132 that are respectively disposed on the mounting blocks 134. The mounting blocks 134 are distributed around the bottom center optical pyrometer 122 and spaced by a distance of between about 50 mm and about 150 mm from a center of the bottom mounting plate 112. In some embodiment, the angles of the angle blocks 132 are set to 100°, 134°, 160°, and 140°. With this set of the angles, the bottom outer optical pyrometers 130 measure temperatures at outer locations 302a-d of the bottom surface 104S' of the susceptor 104 as shown in FIGS. 3 and 4. The outer locations 302a-d of the bottom surface 104S' of the susceptor 104 are spaced from the center location 304 of the bottom surface 104S' of the susceptor 104 by distances of between about 100 and about 170 mm.

In some embodiments, the mounting block 142 is disposed on the top mounting plate 114 spaced from the top center optical pyrometer 124 by a distance of between about 180 mm and about 250 mm. The angle of the angle block 140 mounting the top outer optical pyrometer 138 is set to an angle between 90° and 110°, for example, 100° such that the top outer optical pyrometer 138 measures temperature at a location spaced from the center location of the top surface 106S of the substrate 106 by a distance of between about 100 mm and 150 mm.

In the embodiments described above, temperature profiles of a substrate and a susceptor that supports the substrate are monitored and controlled. Thus, non-uniformity in temperature over a substrate, and thus non-uniformity in thickness of a deposited film is reduced. In addition, repeatability of deposited films over multiple epitaxy processes are improved.

While the foregoing is directed to embodiments of the present disclosure, other and further embodiments of the present disclosure can be devised without departing from the basic scope thereof, and the scope thereof is determined by the claims that follow.

The invention claimed is:

1. An apparatus for controlling temperature profile of a substrate within an epitaxial chamber, comprising:
a bottom center pyrometer disposed on a bottom mounting plate of an epitaxy chamber and configured to measure temperature at a center location of a first surface of a susceptor of the epitaxy chamber, the first surface being heated by a first heating lamp module; a bottom outer pyrometer disposed on the bottom mounting plate and configured to measure temperature at an outer location of the first surface of the susceptor;
a top center pyrometer disposed on a top mounting plate of the epitaxy chamber and configured to measure temperature at a center location of a top surface of a substrate positioned on a second surface of the susceptor opposite the first surface of the susceptor, the substrate being heated by a second heating lamp module;
a top outer pyrometer disposed on the top mounting plate and configured to measure temperature at an outer location of a top surface of a substrate positioned on the second surface of the susceptor;
a first controller configured to receive signals, from the bottom center pyrometer and the bottom outer pyrometer, and output a feedback signal to the first heating lamp module based on the measured temperatures at the center location and at the outer location of the first surface of the susceptor; and
a second controller configured to receive signals, from the top center pyrometer, the top outer pyrometer, the bottom center pyrometer, and the bottom outer pyrometer, and output a feedback signal to the second heating lamp module based on the measured temperatures at the center location and at the outer location of a top surface of a substrate positioned on the second surface of the susceptor and the measured temperatures at the center location and at the outer location of the first surface of the susceptor,
wherein a first angle block is disposed on the bottom mounting plate and configured to mount the bottom center pyrometer thereon,
wherein a second angle block is disposed on the bottom mounting plate and configured to mount the bottom outer pyrometer thereon,
wherein a third angle block is disposed on the top mounting plate and configured to mount the top outer pyrometer thereon.

2. The apparatus according to claim 1, further comprising:
a first mounting block disposed on the bottom mounting plate, wherein the first mounting block is disposed between the first angle block and the bottom mounting plate;
a second mounting block disposed on the bottom mounting plate, wherein the second mounting block is disposed between the second angle block and the bottom mounting plate; and
a third mounting block disposed on the top mounting plate, wherein the third mounting block is disposed between the third angle block and the top mounting plate.

3. The apparatus according to claim 2, wherein: the second mounting block is spaced from the bottom center pyrometer by a distance of between about 50 mm and about 150 mm, and a viewing angle of the second angle block with respect to the bottom mounting plate is between 100° and 160°.

4. The apparatus according to claim 3, wherein the outer location of the first surface of the susceptor is spaced from the center location of the first surface of the susceptor by a distance of between about 100 mm and about 170 mm.

5. The apparatus according to claim 2, wherein: the third mounting block is spaced from the top center pyrometer by a distance of between about 180 mm and about 250 mm, and a viewing angle of the third angle block with respect to the top mounting plate is between 90° and 110°.

6. The apparatus according to claim 5, wherein the outer location of a top surface of a substrate positioned on the first surface of the susceptor is spaced from the center location of the top surface of the substrate by a distance of between about 100 mm and about 150 mm.

7. The apparatus according to claim 1, wherein the feedback signal to the first heating lamp module comprises adjusting power of an inner zone and power of an outer zone of the first heating lamp module independently.

8. The apparatus according to claim 1, wherein the feedback signal to the second heating lamp module comprises adjusting power of an inner zone and power of an outer zone of the second heating lamp module independently.

9. A method of depositing a film on a substrate disposed in an epitaxy chamber, comprising:
measuring a temperature at a center location of a first surface of a susceptor of the epitaxy chamber using a bottom center pyrometer disposed on a first angle block, wherein the first angle block is disposed on a bottom mounting plate of the epitaxy chamber;
measuring a temperature at an outer location of the first surface of the susceptor of the epitaxy chamber using a bottom outer pyrometer disposed on a second angle block, wherein the second angle block is disposed on the bottom mounting plate of the epitaxy chamber;

measuring a temperature at a center location of a top surface of a substrate disposed on a second surface of the susceptor of the epitaxy chamber;

measuring a temperature at an outer location of the top surface of the substrate using a top outer pyrometer disposed on a third angle block, wherein the third angle block is disposed on a top mounting plate of the epitaxy chamber;

adjusting power of a first heating lamp module positioned to heat the first surface of the susceptor based on the measured temperatures at the center location and the outer location of the first surface of the susceptor; and adjusting power of a second heating lamp module positioned to heat the substrate on the second surface of the susceptor based on the measured temperatures at the center location and the outer location of the top surface of the substrate and the measured temperatures at the center location and the outer location of the first surface of the susceptor.

10. The method according to claim 9, wherein power of the second heating lamp module is adjusted during an initial stabilization step of a deposition process.

11. The method according to claim 9, wherein the outer location of the second surface of the susceptor is spaced from the center location of the second surface of the susceptor by a distance of between about 100 mm and about 170 mm.

12. The method according to claim 9, wherein the outer location of a top surface of a substrate positioned on the first surface of the susceptor is spaced from the center location of the top surface of the substrate by a distance of between about 100 mm and about 150 mm.

13. The method according to claim 9, wherein adjusting power of the first heating lamp module comprises adjusting power of an inner zone and power of an outer zone of the first heating lamp module independently.

14. The method according to claim 9, wherein adjusting power of the second heating lamp module comprises adjusting power of an inner zone and power of an outer zone of the second heating lamp module independently.

15. A method of processing a plurality of substrates in an epitaxy chamber, comprising:

measuring temperatures at a center location using a top center pyrometer, and at an outer location using a top outer pyrometer of a first surface of a susceptor of the epitaxy chamber during a first epitaxy process, wherein the top center pyrometer is disposed on a first angle block that is disposed on a bottom mounting plate of the epitaxy chamber and wherein the top outer pyrometer is disposed on a second angle block that is disposed on the bottom mounting plate of the epitaxy chamber;

measuring temperatures at a center location and at an outer location of a top surface of a first substrate disposed on a second surface of the susceptor of the epitaxy chamber during the first epitaxy process;

measuring temperatures at the center location using a top center pyrometer, and at the outer location using a top outer pyrometer of the first surface of the susceptor of the epitaxy chamber during a second epitaxy process, wherein the top outer pyrometer is disposed on a third angle block that is disposed on a top mounting plate of the epitaxy chamber;

measuring temperatures at the center location and at the outer location of a top surface of a second substrate disposed on the second surface of the susceptor of the epitaxy chamber during the second epitaxy process;

during the second epitaxy process, adjusting power of a first heating lamp module that is configured to heat the first surface of the susceptor based on the measured temperatures at the center location and at the outer location of the first surface of the susceptor during the first and second epitaxy processes; and during the second epitaxy process, adjusting power of a second heating lamp module that is configured to heat the top surface of the second substrate disposed on the second surface of the susceptor based on the measured temperatures at the center location and at the outer location of the first and second substrates during the first and second epitaxy processes.

16. The method according to claim 15, wherein power of the second heating lamp module is adjusted during an initial stabilization step of a deposition process.

17. The method according to claim 15, wherein the outer location of the second surface of the susceptor is spaced from the center location of the second surface of the susceptor by a distance of between about 100 mm and about 170 mm.

18. The method according to claim 15, wherein the outer location of a top surface of a substrate positioned on the first surface of the susceptor is spaced from the center location of the top surface of the substrate by a distance of between about 180 mm and about 250 mm.

19. The method according to claim 15, wherein adjusting power of the first heating lamp module comprises adjusting power of an inner zone and power of an outer zone of the first heating lamp module independently.

20. The method according to claim 15, wherein adjusting power of the second heating lamp module comprises adjusting power of an inner zone and power of an outer zone of the second heating lamp module independently.

* * * * *